United States Patent
Steen

(10) Patent No.: US 6,648,210 B1
(45) Date of Patent: Nov. 18, 2003

(54) LEAD-FREE SOLDER ALLOY POWDER PASTE USE IN PCB PRODUCTION

(75) Inventor: Hector Andrew Hamilton Steen, Hemel Hempstead (GB)

(73) Assignee: Multicore Solders Limited, Herts (GB)

( * ) Notice: Subject to any disclaimer, the term of this patent is extended or adjusted under 35 U.S.C. 154(b) by 0 days.

(21) Appl. No.: 09/673,529

(22) PCT Filed: Feb. 16, 2000

(86) PCT No.: PCT/GB00/00533
§ 371 (c)(1),
(2), (4) Date: Feb. 9, 2001

(87) PCT Pub. No.: WO00/48784
PCT Pub. Date: Aug. 24, 2000

(30) Foreign Application Priority Data

Feb. 16, 1999 (GB) .............................................. 9903552

(51) Int. Cl.⁷ ........................ B23K 31/02; B23K 35/34; C22C 7/00
(52) U.S. Cl. .............................. 228/179.1; 228/180.22; 148/24; 148/400; 420/557; 420/561
(58) Field of Search ....................... 228/179.1, 180.22; 427/96; 148/400, 23–26; 420/556–561

(56) References Cited

U.S. PATENT DOCUMENTS

| | | | |
|---|---|---|---|
| 5,229,070 A | * | 7/1993 | Melton et al. ................. 148/24 |
| 5,393,489 A | * | 2/1995 | Gonya et al. ................ 148/400 |
| 5,411,703 A | * | 5/1995 | Gonya et al. ................ 148/400 |
| 5,429,292 A | * | 7/1995 | Melton et al. .......... 228/180.22 |
| 5,439,639 A | * | 8/1995 | Vianco et al. ............... 148/400 |
| 5,508,562 A | * | 4/1996 | Horie et al. ................... 148/24 |
| 5,527,628 A | * | 6/1996 | Anderson et al. ......... 228/262.9 |
| 5,538,686 A | * | 7/1996 | Chen et al. .................. 420/557 |
| 5,716,663 A | * | 2/1998 | Capote et al. ................. 427/96 |
| 5,918,795 A | * | 7/1999 | Yamaguchi et al. ......... 228/200 |
| 5,962,133 A | * | 10/1999 | Yamaguchi et al. ..... 106/286.2 |
| 5,972,246 A | * | 10/1999 | Nikaidoh et al. ........... 252/512 |
| 5,980,785 A | * | 11/1999 | Xi et al. ...................... 252/512 |
| 5,985,212 A | * | 11/1999 | Hwang et al. ............... 420/560 |
| 6,050,480 A | * | 4/2000 | Taguchi et al. .............. 148/400 |
| 6,156,132 A | * | 12/2000 | Yamashita et al. ........... 148/400 |
| 6,187,114 B1 | * | 2/2001 | Ogashiwa et al. ........ 106/286.2 |
| 6,241,145 B1 | * | 6/2001 | Maeda et al. ........... 228/180.22 |
| 6,241,942 B1 | * | 6/2001 | Murata et al. ............... 420/561 |
| 6,267,823 B1 | * | 7/2001 | Yamaguchi et al. ........... 148/24 |
| 2001/0020744 A1 | * | 9/2001 | Kuramoto et al. ........... 420/557 |

FOREIGN PATENT DOCUMENTS

| | | |
|---|---|---|
| EP | 0 787 559 A1 | 8/1997 |
| EP | 0 834 376 A1 | 4/1998 |
| EP | 1180411 A1 * | 2/2002 |
| JP | 01-241395 A * | 9/1989 |
| JP | 6-177525 A * | 6/1994 |
| JP | 2001-150179 A * | 6/2001 |
| WO | WO94/27777 | 12/1994 |
| WO | WO97/43081 | 11/1997 |

* cited by examiner

*Primary Examiner*—Tom Dunn
*Assistant Examiner*—L. Edmondson
(74) *Attorney, Agent, or Firm*—Hoffmann & Baron, LLP

(57) ABSTRACT

Tombstoning susceptibility and reflow peak temperature reduction of solder alloys, in particularly lead-free solder alloys, has been found to be achieved effectively by mixing the solder alloy in the form of an alloy paste with a low melting alloy utilised in powder form, in particular a Bi-containing alloy.

20 Claims, No Drawings

LEAD-FREE SOLDER ALLOY POWDER PASTE USE IN PCB PRODUCTION

This invention relates to lead-free solder alloy powder usage in pastes for soldering components to printed circuit boards (PCB's).

When lead-free solders are used in the soldering of components to printed circuit boards, problems stem from the increase in reflow (soldering) temperature required by the main lead-free alternatives relative to the eutectic Sn(PbAg) solders currently used. The principal lead-free solders are based on the tin-copper, tin-silver and tin-silver-copper eutectics, melting at 227° C., 221° C. and 217° C., respectively. These alloys require relatively high reflow temperatures in the range 230–240° C. to obtain adequate soldering. Reflow temperatures in this range may damage temperature sensitive components. Thus, lead free solders have not yet found widespread adoption in electronics assembly despite their obvious advantages.

In order to lower lead-free alloy melting points below 217° C., and accordingly, lower reflow temperatures, it is possible to alloy the above mentioned lead-free solders with limited amounts of bismuth, generally up to about 10%, typically 2–5% by weight. There is indeed an additional advantage in using bismuth in solid solution in tin in lead-free alloys in that the bismuth has been found to strengthen the lead-free alloys. The addition of bismuth has, however, the disadvantage of introducing a melting range. Thermal strains developing in an assembly on cooling, in conjunction with solder joints with a freezing range can, in unfavorable circumstances, lead to hot cracking. This phenomenon of hot cracking has been observed particularly in plated-through-hole applications but not in surface mount reflow soldering, so bismuth-containing alloys are viable in many solder paste applications.

A defect commonly found on reflow soldered printed circuit boards is that when chip components solder faster at one end than another and as a consequence are pulled by surface tension, they stand vertically on one pad, creating an electrical discontinuity. It is for this reason that this behavior is known as tombstoning. In current practice with lead-containing solders, this is addressed by using a solder alloy with a melting range, but, where lead-free solders are concerned, no solution has been proposed.

Sn—Ag—Bi and Sn—Ag—Cu—Bi alloy compositions are well documented as lead-free solder alloys. The concept of combining high and low melting point alloy powders to form a mixture which melts at a low temperature but forms a high melting point joint is also well documented. However, the use of such alloys with a melting range to inhibit tombstoning is not known, and has not been documented.

We have found that solder pastes made with mixtures of Sn63Pb37 powder and Sn62Pb36Ag2 powder, melting at 183° C. and 179° C. respectively surprisingly give a significantly reduced tendency to tombstoning as compared to pastes made up with prealloyed powders, when used to solder chip components on printed circuit boards.

On this basis we have concluded that use of a mixture of a SnBi alloy powder, such as a Sn43Bi57 powder, and a SnAgCu alloy powder, such as Sn96.5Ag3.8Cu0.7 powder, such specific alloys melting at 138° C. and 217° C. respectively, in a (lead-free) paste, will analogously also have an anti-tombstoning effect as well as enable the paste to start to reflow at a lower temperature than if prealloyed powder were used.

According to the present invention, there is provided a method for reducing the tendency of tombstoning when using a lead-free solder alloy in a solder paste to attach a chip component of a printed circuit board, which comprises formulation the solder paste by adding to a paste of a first solder alloy powder, which paste is a lead-free solder paste, a SnBi alloy powder, which is lower melting than the first solder alloy powder, to produce a bismuth containing final alloy containing from 1–10% bismuth, the first solder alloy containing 0–5% Cu, 0–10% Ag and 0–5% Sb, the remainder as being Sn and at least one of Cu, Ag and Sb being present in a minimum amount of 0.1%.

All percentages expressed herein are on a weight basis.

We have further found that the reduction in tombstoning is enhanced if the lower melting alloy is present as a finer size powder than the higher melting alloy which is present as a larger size powder. Preferably, the lower melting point alloy is employed in the form of a powder of which the particle size is predominantly less than 25 μm diameter, while the first solder alloy powder particle size is predominantly greater than 25 μm diameter. More preferably, the lower melting point alloy particle size is predominantly in the range 10–25 μm and the first solder alloy particle size is predominantly 20–45 μm. By the word predominately, it is meant that more than 50% by wt., preferably more than 75% and most preferably all of the alloy in question has the indicated particle size. It is hypothesised that the fine lower melting powder particles melt first and form a network of liquid around the larger powder particles. This liquid network enables wetting to take place more readily and initiate reflow, and maximises the effective melting range to minimise tombstoning.

In preferred practice, there is used a starting alloy containing up to 3% Cu, up to 5% Ag, and up to 5% Sb, the remainder being Sn and at least one of the elements Cu, Ag and Sb being present in an amount of at least 0.1%.

A further advantage of the use of SnBi as powder admixture stems from the fact that, in solder pastes, the oxide content of the powder needs to be as low as possible, to give good reflow. Adding bismuth to a high tin or tin-lead solder in conventional manner changes the oxide formed on the powder surface from tin oxide to mixed oxide containing bismuth as well as tin. The mixed oxide grows faster that the tin oxide, so bismuth alloy solder powders contain more oxide than non-bismuth alloy solders, and deteriorate faster in storage. Making the alloy using a powder and mixture will give a lower overall oxide content, hence better storage and reflow properties.

It has already been stated herein that the final alloy should have a Bi content of 1–10% this amount preferably being in the range from 2–6% and most preferably being about 5%. Up to 1% of Ag, Cu and Sb can each be employed in the bismuth containing additive alloy which preferably contains 40–70% Bi and the remainder tin. Because of these two factors, if one or more of Ag, Cu and Sb is to be present, preferably care should be taken to have the final alloy show the following analysis:

| | |
|---|---|
| Ag | up to 6% |
| Cu | up to 3% |
| Sb | up to 5% |
| Bi | 1–10% |
| Sn | rest |

What is claimed is:

1. A method for reducing tombstoning tendency when using a lead-free alloy in a solder paste to attach a chip component to a printed circuit board in a reflow soldering process, which comprises formulating the solder paste used by adding to a paste of a first solder alloy powder, which paste is a lead-free solder paste, a SnBi alloy powder, which is lower melting than the first solder alloy powder, to produce a bismuth containing final alloy containing from 1–10% bismuth, the first solder alloy containing 0–5% Cu, 0–10% Ag and 0–5% Sb, the reminder being Sn and at least one of Cu, Ag and Sb being present in a minimum amount of 0.1%, wherein said first solder alloy and said SnBi alloy are preselected to provide a final alloy having a melting point range sufficient to inhibit tombstoning.

2. A method as claimed in claim 1, wherein the first solder alloy powder contains from 0.1–3% Cu, from 0.1–5% Ag and from 0.1–5% Sb.

3. A method as claimed in claim 1, wherein the first solder alloy powder has the composition SnAg3.8Cu0.7.

4. A method as claimed in claim 1, wherein the final alloy has a Bi content in the range from 2–6%.

5. A method as claimed in claim 1, wherein the SnBi alloy powder contains from 40–70% Bi.

6. A method as claimed in claim 1, wherein the SnBi alloy powder additionally contains one or more of Ag, Cu and Sb.

7. A method as claimed in claim 1, wherein the final alloy has an analysis:

| Ag | up to 6% |
|---|---|
| Cu | up to 3% |
| Sb | up to 5% |
| Bi | 1–10% |
| Sn | rest |

8. A method as claimed in claim 1, which is applied to the production of a solder pad affixing a component to the surface of a conductor on a dielectric substrate.

9. A method as claimed in claim 1, wherein the lower melting point alloy is employed in the form of a powder having a finer particle size than that of the first solder alloy powder particle size.

10. A method as claimed in claim 9, wherein the lower melting point alloy powder particle size is predominately less than 25 μm diameter, while the first solder alloy powder particle size is predominately greater than 25 μm diameter.

11. A method for reducing tombstoning tendency when using a lead-free alloy in a solder paste to attach a chip component to a printed circuit board in a reflow soldering process, which comprises:

formulating the solder paste used by combining a first lead-free solder alloy powder and a second SnBi alloy powder, which has a lower melting point than the first solder alloy powder, and forming a final solder paste, wherein said final paste contains from 1–10% bismuth, and said first solder alloy powder contains 0–5% Cu, 0–10% Ag and 0–5% Sb, the reminder being Sn and at least one of Cu, Ag and Sb being present in a minimum amount of 0.1%, and wherein said first solder alloy powder and said SnBi alloy powder are preselected to provide a final paste having a melting point range sufficient to inhibit tombstoning.

12. A method as claimed in claim 11, further comprising forming a first solder alloy paste from said second SnBi alloy powder and adding said first lead-free solder alloy powder to said first solder alloy paste to form said final solder paste.

13. A method as claimed in claim 11, wherein the first solder alloy powder has the composition SnAg3.8Cu0.7.

14. A method as claimed in claim 11, wherein the final paste has a Bi content in the range from 2–6%.

15. A method as claimed in claim 11, wherein the SnBi alloy powder contains from 40–70% Bi.

16. A method as claimed in claim 11, wherein the SnBi alloy powder additionally contains one or more of Ag, Cu and Sb.

17. A method as claimed in claim 11, wherein the final solder paste has an analysis:

| Ag | up to 6% |
|---|---|
| Cu | up to 3% |
| Sb | up to 5% |
| Bi | 1–10% |
| Sn | rest |

18. A method as claimed in claim 11, which is applied to the production of a solder pad affixing a component to the surface of a conductor on a dielectric substrate.

19. A method as claimed in claim 11, wherein the lower melting point solder alloy powder has a finer particle size than that of the first solder alloy powder particle size.

20. A method as claimed in claim 19, wherein the lower melting point solder alloy powder particle size is predominately less than 25 μm diameter, while the first solder alloy powder particle size is predominately greater than 25 μm diameter.

* * * * *

UNITED STATES PATENT AND TRADEMARK OFFICE
CERTIFICATE OF CORRECTION

PATENT NO.    : 6,648,210 B1  Page 1 of 1
DATED         : November 18, 2003
INVENTOR(S)   : Steen, H.

It is certified that error appears in the above-identified patent and that said Letters Patent is hereby corrected as shown below:

Column 2,
Line 41, the printed patent should read -- ...grows faster than the tin... --.

Column 3,
Line 7, the printed patent should read -- ...Sb, the remainder being Sn... --.

Column 4,
Line 5, the printed patent should read -- ...Sb, the remainder being Sn... --.

Signed and Sealed this

Third Day of February, 2004

JON W. DUDAS
*Acting Director of the United States Patent and Trademark Office*